(12) United States Patent
Bollenbeck (10) Patent No.: US 8,390,292 B2
(45) Date of Patent: Mar. 5, 2013

(54) METHOD AND ARRANGEMENT TO TRANSMIT MAGNETIC RESONANCE SIGNALS

(75) Inventor: Jan Bollenbeck, Eggolsheim (DE)

(73) Assignee: Siemens Aktiengesellschaft, Munich (DE)

( * ) Notice: Subject to any disclaimer, the term of this patent is extended or adjusted under 35 U.S.C. 154(b) by 590 days.

(21) Appl. No.: 12/704,697

(22) Filed: Feb. 12, 2010

(65) Prior Publication Data

US 2010/0201365 A1    Aug. 12, 2010

(30) Foreign Application Priority Data

Feb. 12, 2009  (DE) .......................... 10 2009 008 623

(51) Int. Cl.
*G01V 3/00* (2006.01)
(52) U.S. Cl. ........................ 324/322; 324/318
(58) Field of Classification Search .................. 324/322, 324/318, 307, 309, 300
See application file for complete search history.

(56) References Cited

U.S. PATENT DOCUMENTS

| | | | | |
|---|---|---|---|---|
| 5,280,246 A * | 1/1994 | Takahashi et al. | ............ | 324/322 |
| 6,441,797 B1 * | 8/2002 | Shah | .............................. | 343/840 |
| 7,398,067 B2 * | 7/2008 | Wolf | .............................. | 455/137 |
| 7,400,148 B2 * | 7/2008 | Adachi | ......................... | 324/322 |
| 7,449,886 B2 * | 11/2008 | Buchwald | ..................... | 324/311 |
| 8,055,196 B2 * | 11/2011 | Biber et al. | ................. | 455/41.2 |
| 2006/0214662 A1 | 9/2006 | Adachi | | |

\* cited by examiner

*Primary Examiner* — Louis Arana
(74) *Attorney, Agent, or Firm* — Schiff Hardin LLP

(57) ABSTRACT

In a method and an arrangement for magnetic resonance signal transmission, a first channel of a local coil arrangement has a first individual antenna that receives a first magnetic resonance signal, and a first frequency converter connected with the first individual antenna, and the first frequency converter forms a first signal with the first magnetic resonance signal supplied thereto and a first oscillator signal supplied thereto. A second channel of the local coil arrangement has a second individual antenna that receives a second magnetic resonance signal, and a second frequency converter connected with the second individual antenna, and the second frequency converter forms a second signal from the second magnetic resonance signal supplied thereto and a second oscillator signal supplied thereto. The local coil arrangement has a signal combination device that applies the first signal and the second signal to a single transmission path. At least one of the oscillator signals has a frequency that corresponds to the difference between the frequency of a first synthesizer frequency signal and the frequency of a second synthesizer frequency signal that are supplied to the local coil arrangement.

16 Claims, 6 Drawing Sheets

| Nucleus | $f_{MR}$ [MHz] | $LO_1$ [MHz] | $ZF_1$ [MHz] | $LO_2$ [MHz] | $ZF_1$ [MHz] |
|---|---|---|---|---|---|
| 19F | 115.9 | 107.5 | 8.4 | 127.5 | 11.6 |
| 3He | 93.9 | 102.5 | 8.6 | 82.5 | 11.4 |
| 31P | 49.9 | 57.5 | 7.6 | 37.5 | 12.4 |
| 7Li | 47.9 | 40.0 | 7.9 | 60.0 | 12.1 |
| 129Xe | 34.1 | 25.0 | 8.4 | 45.0 | 11.6 |
| 23Na | 32.6 | 25.0 | 7.6 | 45.0 | 12.4 |
| 13C | 31.0 | 22.5 | 8.5 | 42.5 | 11.5 |
| 17O | 16.7 | 25.0 | 8.3 | 5.0 | 11.7 |
| 15N | 12.5 | 20.0 | 7.5 | 0.0 | 12.5 |

(X-nucleus LO frequency plan)

FIG 5

| X-nucleus | RF [MHz] | X-nucleus Synthesizer 1 [MHz] | X-nucleus Synthesizer 2 [MHz] | 1H Synthesizer 2 [MHz] | 1H Synthesizer 1 [MHz] | X-nucleus LO [MHz] | X-nucleus LO 2 [MHz] | ZF1 [MHz] | ZF2 [MHz] |
|---|---|---|---|---|---|---|---|---|---|
| 19F | 115.9040 | 107.5 | 127.5 | OFF | OFF | 107.5 | 127.5 | 8.4 | 11.6 |
| 3He | 93.8524 | 102.5 | 82.5 | OFF | OFF | 102.5 | 82.5 | 8.6 | 11.4 |
| 31P | 49.8719 | 57.5 | 37.5 | OFF | OFF | 57.5 | 37.5 | 7.6 | 12.4 |
| 7Li | 47.8799 | 40 | 60 | OFF | OFF | 40 | 60 | 7.9 | 12.1 |
| 129Xe | 34.0816 | 92.5 | OFF | 135 | 115 | 42.5 | 22.5 | 8.4 | 11.6 |
| 23Na | 32.5885 | 90 | OFF | 135 | 115 | 45 | 25 | 7.6 | 12.4 |
| 13C | 30.9806 | 92.5 | OFF | 135 | 115 | 42.5 | 22.5 | 8.5 | 11.5 |
| 17O | 16.7012 | 110 | OFF | 135 | 115 | 25 | 5 | 8.3 | 11.7 |
| 15N | 12.48 | 115 | OFF | 135 | 0 | 20 | 0 | 7.5 | 12.5 |

(Frequency configurations in X-nucleus operation)

_METHOD AND ARRANGEMENT TO TRANSMIT MAGNETIC RESONANCE SIGNALS_

BACKGROUND OF THE INVENTION

1. Field of the Invention

The present invention concerns an arrangement and a method to transmit magnetic resonance signals that are received with the use of local coils.

2. Description of the Prior Art

An arrangement to transmit magnetic resonance signals that are received with the use of local coils is described in the DE 10 2008 023 467.2.

Modern magnetic resonance systems simultaneously receive magnetic resonance signals via local antennas that are placed on the patient. These local antennas are components of what is known as a local coil or "local coil arrangement". The received magnetic resonance signals are preamplified, conducted out of a central region of the magnetic resonance system and supplied to a shielded receiver in order to be used there for image processing.

The connection lines used for transmission are generally directed within a patient bed supported such that it is movable, and therefore are multiple meters in length. However, the technical problems shown in the following result due to the use of connection lines.

Cables that are used exhibit attenuations in the frequency range of the magnetic resonance signals that are to be transmitted that must be taken into account. A patient-proximal preamplification of the magnetic resonance signals ensues before the transmission for thus purpose, wherein heat is however formed in proximity to the patient. Low-attenuation cables are presently used for transmission that, however, exhibit a large cable diameter and are correspondingly unwieldy.

Each local antenna forms a reception channel that has a connection cable associated with it to transmit the magnetic resonance signal. An unwieldy cable bundle is likewise formed by the plurality of reception channels, which cable bundle is also exposed to increased mechanical loads at the employed cable plugs due to the movement of the patient bed.

The problem of the aforementioned thick cable bundle is exacerbated because the cable bundle runs in part in the radio-frequency field of the magnetic resonance transmission antenna and therefore contains sheath wave barriers. The cable bundle thickness is additionally increased again due to their dimensions.

Conventionally used coaxial multiconductor plugs are expensive in terms of wiring and unwieldy in application for the operator.

Conventionally used preamplifiers must exhibit a high linearity of the characteristic amplifier line over a large range in order to form low-distortion output signals. This is connected with a high power requirement and with significant heating near the patient.

Conventionally, broadband receivers are used that can receive outgoing magnetic resonance signals not only of hydrogen but also of other atoms (also called X-nucleus operation, thus operation with different nuclei). Such receivers have a transmission network that contains ferrite cores. Due to the ferrite cores, the receiver cannot be operated in the immediate environment of the static basic field of the magnetic resonance apparatus, such that again long connection paths are necessary that lead to the technical problems cited above.

In an arrangement to transmit magnetic resonance signals received with the use of local coils as described in DE 10 2008 023 467.2, two local coil signals in a magnetic resonance system are multiplexed via a connection line (frequency multiplexing). The two intermediate frequencies are selected so that they come to lie symmetrically around the scanning frequency of the following analog-digital converter.

Magnetic resonance signals received from local coils are present at a frequency converter and are respectively shifted by the frequency converter to an intermediate frequency and output with this intermediate frequency, wherein the level of the intermediate frequency respectively depends on the frequency of an oscillator signal, which oscillator signal is present at the frequency converter. The oscillator signal is respectively supplied to the local coil arrangement via coaxial cables, which coaxial cables are likewise used to transmit magnetic resonance signals (with an intermediate frequency) to an evaluation device. One or more oscillator signals (to the local coil arrangement) and one or more magnetic resonance signals (respectively transformed to an intermediate frequency, traveling away from the local coil arrangement) can thus be transferred on one coaxial cable.

A problem occurs when the arrangement should be used for the reception of X-nucleus signals (signals of different excited atomic nuclei, for example 19F, 3He, 31P, 7Li, 129Xe, 23Na, 13C, 17O, 15N etc.) which lie markedly below $RF_{1H}$ in the frequency spectrum. In these cases at least one of the two LO frequencies (respectively generated by an oscillator) moves near to the intermediate frequency band $ZF_1$ (used to transmit usable signals from local coils) such that a spectral ZF/LO separation in the corresponding filters is complicated. The LO and intermediate frequencies are associated with the respective X-nuclei in the table "X-nuclei LO frequency plan). LO frequencies lower than 30 MHz are hereby not used for the cited reason.

SUMMARY OF THE INVENTION

An object of the present invention is to provide an improved arrangement to transmit received magnetic resonance signals.

This object is achieved by an arrangement according to the invention for the transmission of magnetic resonance signals, in which a first channel of a local coil arrangement has a first individual antenna to receive a first magnetic resonance signal and a first frequency converter connected with the first individual antenna, wherein the first frequency converter forms a first signal with the first magnetic resonance signal supplied to it and an oscillator signal supplied to it, and in which a second channel of the local coil arrangement has a second individual antenna to receive a second magnetic resonance signal and a second frequency converter connected with the second individual antenna, wherein the second frequency converter forms a second signal from the second magnetic resonance signal supplied to it and an oscillator signal supplied to it. The local coil arrangement has a signal combination device that applies the first signal and the second signal on one transmission path. At least one oscillator signal has a frequency that corresponds to the difference between the frequency of a first synthesizer frequency signal and the frequency of an additional synthesizer frequency signal, and the first cited synthesizer frequency signal and the additionally cited synthesizer frequency signal are present at the local coil arrangement.

The invention also encompasses a method to transmit magnetic resonance signals in which a first magnetic resonance signal is received via a first channel of a local coil arrangement with a first individual antenna, and an intermediate-frequency first signal is formed from the supplied first magnetic resonance signal and a supplied oscillator signal with a first mixer connected with the first individual antenna, and in which a second magnetic resonance signal is received via a second channel of a local coil arrangement with a second individual antenna, and an intermediate-frequency second signal is formed from the supplied second magnetic resonance signal and an oscillator signal with a second mixer connected with the second individual antenna. A signal combination device of the local coil arrangement combines the intermediate-frequency first signal and the intermediate-frequency second signal by means of frequency multiplexing and applies them to one transmission path. At least one of the oscillator signals is formed with a frequency that respectively corresponds to the difference between the frequency of a synthesizer frequency signal and the frequency of an additional synthesizer frequency signal, and the synthesizer frequency signals are present at the local coil arrangement.

DESCRIPTION OF THE PREFERRED EMBODIMENTS

Figure 1:
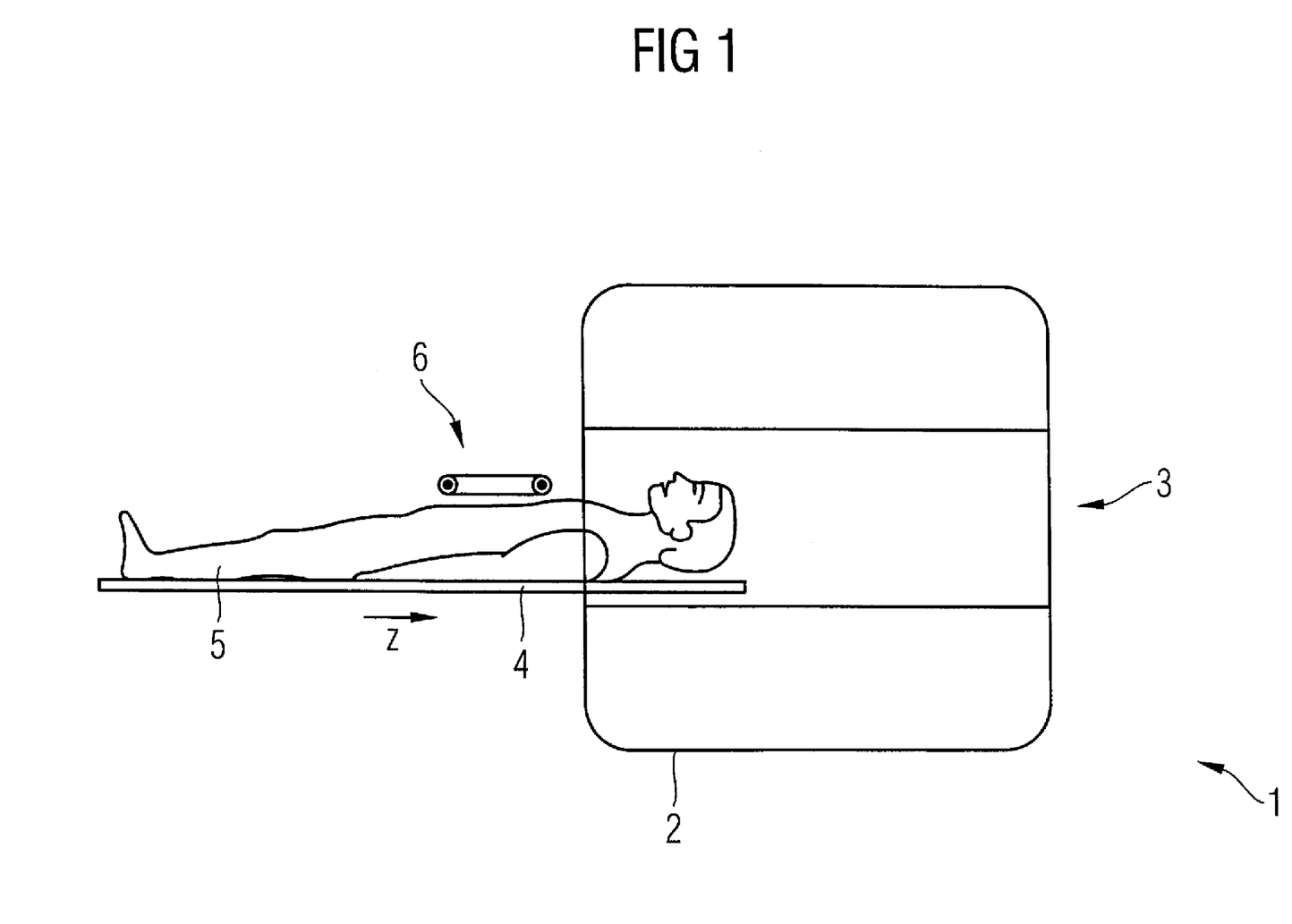
FIG. 1 schematically illustrates an MRT whole-body coil and a local coil arrangement whose position is determined.

FIG. 1 shows a magnetic resonance apparatus MRT 1 with a whole-body coil 2 with a tube-shaped space 3 into which a patient bed 4 with, for example, a patient 5 and a local coil arrangement 6 can be driven in the direction of the arrow z in order to generate exposures of the patient 5. A local coil array 6 (with multiple local coils and channels for signals from the local coils) here is placed on the patient, with which local coil array 6 good exposures are enabled in a local region and whose signals can be evaluated (converted into images etc.) by a known evaluation device that can be connected via coaxial cables, etc.

Figure 2:
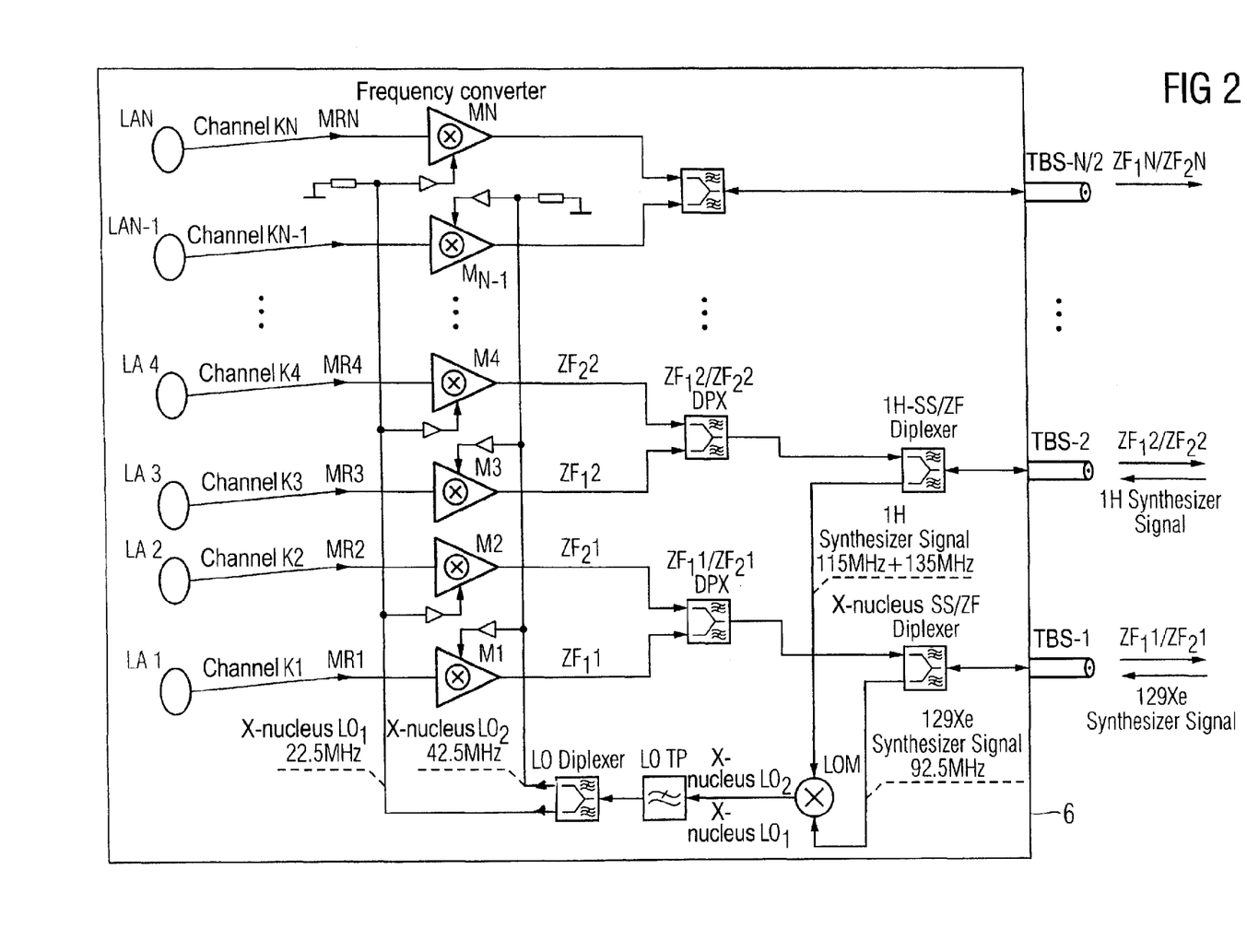
FIG. 2 schematically illustrates the basic components of a reception converter for frequency conversion and transmission of magnetic resonance signals, FIG. 3 schematically illustrates the basic components of an intermediate frequency receiver to process magnetic resonance signals and a frequency synthesizer to synthesize local oscillator signals.

FIG. 2 shows in a basic representation the arrangement according to the invention for the transmission of received magnetic resonance signals (MR1, MR2 . . . MRN).

A local coil arrangement 6 possesses multiple channels (channel K1 through channel KN, for example).

Each channel K1, K2 etc. in turn contains an individual antenna LA1 or, respectively, LA2, a preamplifier (not shown) and a frequency converter (also called a mixer in the following) M1, M2, . . . , MN.

A first individual antenna LA1 designed as a loop antenna is associated with the first channel K1 while a second individual antenna LA2 designed as a loop antenna is associated with the second channel K2.

A first magnetic resonance signal MR1 is received via the first individual antenna LA1 while a second magnetic resonance signal MR2 is received via the second individual antenna LA2.

The received first magnetic resonance signal MR1 arrives at a first mixer M1 via a known preamplifier (not shown; "Low Noise Amplifier" etc.).

The receiver second magnetic resonance signal MR2 arrives at a second mixer M2 via a (known) preamplifier (not shown).

A frequency conversion of the amplified first magnetic resonance signal MR1 into a first intermediate frequency range ZF1 ensues at the first mixer M1 with the use of a first oscillator frequency "X-nucleus$_{LO2}$" connected there. An intermediate-frequency first signal $ZF_1 1$ with the intermediate frequency ZF1 is thus formed.

A frequency conversion of the amplified second magnetic resonance signal MR2 into a second intermediate frequency range ZF2 ensues at the second mixer M2 with the aid of a second oscillator frequency "X-nucleus L01" connected there. An intermediate-frequency second signal $ZF_2 1$ is therefore formed.

The intermediate-frequency first signal $ZF_1 1$ and the intermediate-frequency second signal $ZF_2 1$ are combined with the use of a signal combination device in the form of a diplexer "$ZF_1 1/ZF_2 1$ DPX" into an intermediate-frequency transmission signal "$ZF_1 1, ZF_2 1$" and transmitted on a coaxial cable TBS-1. In addition to a signal component of the first intermediate-frequency range $ZF_1 1$, the intermediate-frequency transmission signal "$ZF_1 1, ZF_2 1$" on the coaxial cable TBS-1 therefore also has, from the frequency multiplexer, a signal component of the second intermediate-frequency range $ZF_2 1$.

A frequency conversion of the amplified magnetic resonance signal MR3 into an intermediate frequency range ZF1 ensues at a mixer M3 with the use of a first oscillator frequency "X-nucleus $LO_2$" connected there. An intermediate-frequency signal $ZF_1 2$ is therefore formed.

A frequency conversion of the amplified magnetic resonance signal MR4 into an intermediate frequency range ZF2 ensues at a mixer M4 with the use of a second oscillator frequency "X-nucleus $LO_1$" connected there. An intermediate-frequency signal $ZF_2 2$ is thus formed.

The intermediate-frequency signal $ZF_1 2$ and the intermediate-frequency signal $ZF_2 2$ are combined by a diplexer "$ZF_1 2/ZF_2 2$ DPX" into an intermediate-frequency transmission signal "$ZF_1 2, ZF_2 2$" and transmitted on a coaxial cable TBS-2. In addition to a signal component of the intermediate-frequency range $ZF_1 2$, the intermediate-frequency transmission signal "$ZF_1 2, ZF_2 2$" on the coaxial cable TBS-2 therefore also has, from the frequency multiplexer, a signal component of the intermediate-frequency range $ZF_2 2$.

The oscillator signals "X-nucleus LO1", "X-nucleus $LO_2$" here are formed from three synthesizer signals that come into the local coil arrangement 6 via coaxial cables TBS-1, TBS-2 (thus from outside the local coil arrangement 6). These three synthesizer signals are the two synthesizer signals "1H synthesizer signal 115 MHz+135 MHz" that both (115 MHz and 135 MHz) come into the local coil arrangement 6 via the coaxial cable TBS-2, and the third synthesizer signal "129Xe synthesizer signal 92.5 MHz" is directed into the local coil arrangement 6 via the coaxial cable TBS-1. One or more oscillator signals (toward the local coil arrangement) and/or one or more magnetic resonance signals (away from the local coil arrangement; respectively transformed to an intermediate frequency) thus can be transmitted on one coaxial cable.

The third synthesizer signal "129Xe synthesizer signal 92.5 MHz" is respectively subtracted from the two synthesizer frequencies "1H synthesizer signal 115 MHz+135 MHz" with the component "LO mixer", and the two oscillator frequencies "X-nucleus LO$_1$" (here 22.5 MHz=115 MHz±92.5 MHz), "X-nucleus$_{LO2}$" (here 42.5 MHz=135 MHz−92.5 MHz) created with a difference of the frequencies of two synthesizer signals are transmitted here via a low-pass filter (in order to suppress unwanted mixing products) to a component "LO diplexer" that places the oscillator frequency "X-nucleus LO$_1$" (here 22.5 MHz) at one input of the frequency converter M2, M4, MN and places the oscillator frequency "X-nucleus$_{LO2}$" (here 42.5 MHz) at one input of the frequency converter M1, M3, MN-1.

The oscillator frequencies "X-nucleus LO$_1$", "X-nucleus$_{LO2}$" can therefore be generated from the (three) synthesizer frequency signals "1H synthesizer signal 115 MHz+135 MHz" and "129Xe synthesizer signal 92.5 MHz" arriving via one or (here) more transmission paths TBS-1, TBS-2.

Oscillator frequencies "X-nucleus LO$_1$", "X-nucleus LO$_2$" are used that are higher (here markedly higher) than the transmission signals ZF$_1$2, ZF$_2$2, ZF$_1$1, ZF$_2$1, such that in a receiving evaluation unit (FIG. 3) the transmission signals ZF$_1$2, ZF$_2$2, ZF$_1$1, ZF$_2$1 can be better separated (for example with a diplex filter LO/ZF-DPF) from the synthesizer frequency signals "1H synthesizer signal 115 MHz+135 MHz" and "129Xe synthesizer signal 92.5 MHz" coming from there (to the local coil arrangement) than this would be possible with the oscillator frequencies "X-nucleus LO$_1$", "X-nucleus LO$_2$" that can lie closer to possible frequencies of the transmission signals ZF$_1$2, ZF$_2$2, ZF$_1$1, ZF$_2$1 than the synthesizer frequency signals.

According to the invention, the X-nucleus-oscillator signals can thus be generated in a frequency converter M1; M2 ... M$_N$ via mixing of multiple synthesizer signals (here of "1H synthesizer signal 115 MHz+135 MHz" with "129Xe synthesizer signal 92.5 MHz"). Given a local coil 6 with N coil elements, for example, the X-nucleus 129Xe synthesizer signal is transferred on the first connection line TBS-1 (in the following, for illustration the oscillator signal conducted on the line is also designated as a synthesizer frequency signal or synthesizer signal and the oscillator signal ("X-nucleus LO$_1$" or "X-nucleus LO$_2$") ultimately supplied to the frequency converters M1-M$_N$ is designated as an LO signal). The 1H synthesizer signal is conducted to the local coil arrangement 6 no the second connection line TBS-2, for example (as a two-tone signal; two synthesizer frequencies are thus transmitted here). Finally. the conductors [lines] 3 through N/2 here conduct the respective ZF signals (ZF$_1$2, ZF$_2$2, ZF$_1$1, ZF$_2$1) and not synthesizer signals.

For example, in the frequency converter unit (the local coil arrangement 6) frequencies usable for N coil elements in FIG. 2 are used for a "129Xe nucleus) operation (transmission of received resonance signals from 129Xe atomic nuclei). The two synthesizer signals are respectively spectrally separated from ZF signals (such as ZF$_1$2, ZF$_2$2) by means of the frequency diplexers "1H synthesizer signal/ZF diplexer" and "129Xe synthesizer signal/ZF diplexer" and provided to the LO mixer "LOM".

For a frequency configuration with low intermediate frequency (ZF<f$_{LO}$), the mix product (which contains a signal with a frequency that corresponds to the difference of the frequency of one of the 1H synthesizer signals "1H synthesizer signal 115 MHz+135 MHz" and the X-nucleus synthesizer signal "129Xe synthesizer signal 92.5 MHz") is filtered out via a low-pass "LO TP" and is subsequently separated by means of an LO diplexer ("LO diplexer") into the sub-components "X-nucleus LO$_1$" and "X-nucleus LO$_2$". The processing at the reception side ("ground station") respectively corresponds to the arrangement according to FIG. 3 for the lines TBS-1 and TBS-2, for example.

For the additional lines TBS-3 through TBS-N/2, no "high/low-pass diplexer" such as LO TP) is respectively required to separate intermediate-frequency transmission signals "ZF$_1$2, ZF$_2$2" and synthesizer signals (which are not transmitted on these lines).

Figure 5:
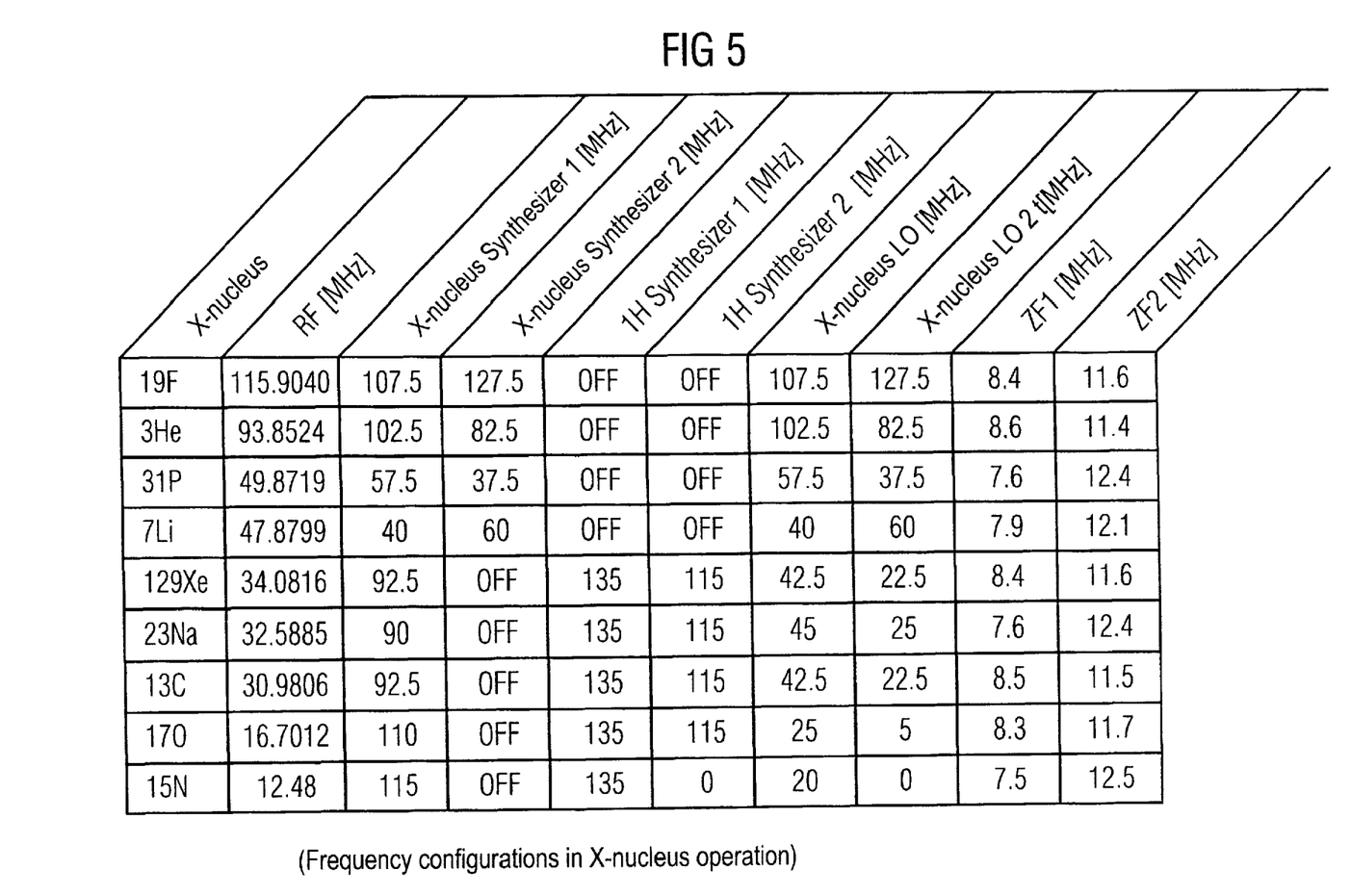
FIG. 5 is a table with frequency configurations in an X-nucleus operation of the local coil arrangement (in operation with an evaluation of MRT signals of different atomic nuclei).

The table "Frequency configurations in X-nucleus operation") in FIG. 5 shows the frequency configurations for a reception and a transmission of magnetic resonance signals that originate from different X-nuclei (thus from different atomic nuclei).

Given reception of MRT resonance signals of nuclei 19F, 3He, 31P and 7Li, a preparation of the X-nucleus LO signals (via an oscillator signal that is formed from a difference of two incoming synthesizer signals) is not necessary since the frequency of the LO$_1$ signal and LO$_2$ signal respectively lies above 30 MHz. In the simplest case here the LO mixer LOM is statically connected through; the X-nucleus synthesizer signals thus simply pass through. A 1H synthesizer (not shown in FIG. 2) that generates the 1H synthesizer signal (for example in a receiver arrangement according to FIG. 3) which is supplied via TBS-2 to the local coil arrangement 6 can remain deactivated.

The reception on the 15N frequency represents a special case. Since the reception frequency lies in the upper ZF band, the corresponding mixer can be statically switched. The lower intermediate frequency ZF (with which intermediate frequency one of the signals MR1 ... MRN is transmitted) is generated with a frequency converter from two synthesizer frequencies (for example via "mixing").

According to one exemplary embodiment of the invention, the required X-nucleus oscillator signals are generated within the frequency converter unit via mixing of two synthesizer signals. The frequencies of the two synthesizer signals are selected such that they exhibit a sufficiently large spectral distance from the employed intermediate frequency bands; a spectral separation of LO and ZF signals (within a high-pass or low-pass etc.) is hereby simplified. The preparation in "satellites" (=the local coil arrangement 6) can occur in a purely passive manner (for example via diode mixers M1 ... M$_N$). Therefore no additional power loss (heat) arises within the "satellites" (6) which can comprise a local coil housing in patient proximity.

The resulting oscillator signals are only generated once per converter unit (for example local coil arrangement with N coil elements). Frequency diplexers are hereby saved both in the "satellites" (FIG. 2) and in the "ground station" (FIG. 3) which can receive signals ZF via transmission paths TBS-1, ..., TBS-N/2.

The frequency synthesizer in a ground station (for example according to FIG. 3) can be connected to one and the same frequency reference (phase synchronicity with the rest of the system).

For example, simple ring diode mixers (for example MiniCircuits JMS-1) could be used as a frequency converter; however, these contain transmitters wound on ferrite and therefore cannot be operated in the static magnetic field of the system (ferrite goes into saturation), which is why a ferrite-free variant would be preferably used; particular properties would be: magnetic field-compatible, low conversion loss, low required LO power, no additional DC power required. In addition to an in-house development, a product already available commercially (with exceptions for power consumption, noise factor and size) could possibly be the following Analog Devices component AD8342: http://www.analog.com/static/importedfiles/data_sheets/AD8342.pdf http://www.analog.com/en/rfifcomponents/mixersmultipliers/AD8343/products/product.html.

A ground station (FIG. 3) can, for example, evaluate signals received via a transmission path TBS-1, TBS-2, . . . TBS-N as follows.

Figure 3:
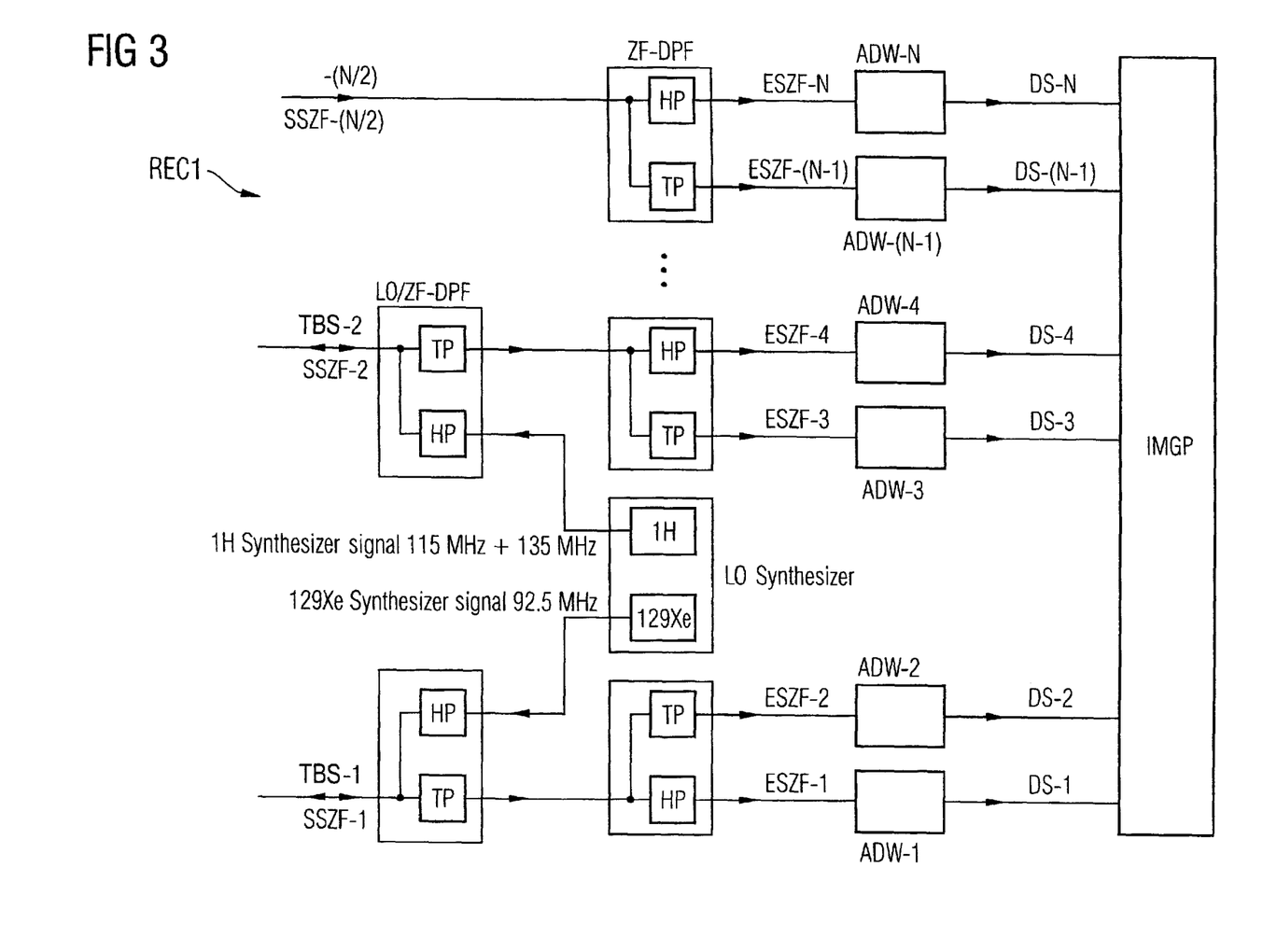
Figure 4:
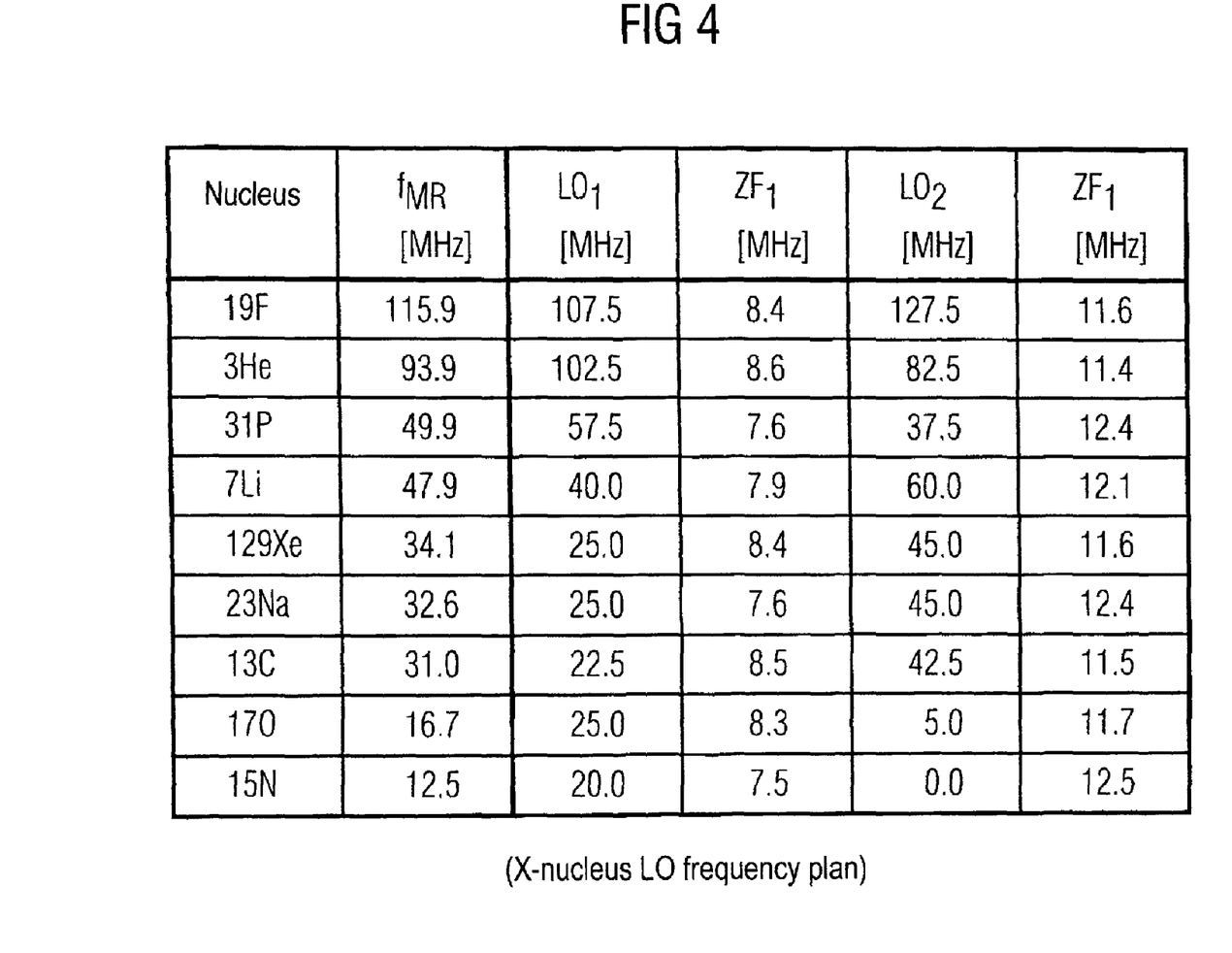
FIG. 4 is a table with an X-nucleus LO frequency plan.

FIG. 3 shows a receiver REC1 in a basic representation and with reference to FIG. 1.

The transmission signal SSZF-1 (=comprising the signals ZF11 and ZF21 from FIG. 1, for example) arrives via the transmission path TBS-1 at a diplex filter ZF-DPF with which the transmission signal SSZF transmitted by means of the frequency multiplexer method is divided up into two intermediate-frequency reception signals ESZF-1 and ESZF-2.

For this purpose the diplex filter ZF-DPF contains a high-pass branch HP and a low-pass branch TP in order to form filtered, intermediate-frequency reception signals ESZF-1 and ESZF-2.

It should be noted that the diplex filter used at the local coil arrangement 6 and the diplex filter used at the receiver REC1 do not need to be executed exactly alike in terms of technology.

The diplex filter DPF used at the local coil arrangement 6 is reasonably used (as described, in FIG. 2) as a "merging filter" or, respectively, as a "diplex combiner" while the diplex filter DPF used at the receiver REC1 is reasonably used as a "diplex splitting filter" or, respectively, as a "diplex splitter".

An intermediate-frequency first reception signal ESZF-1 (which can be the signal $ZF_11$ in FIG. 2, for example) arrives at a first analog-digital converter ADW1 while an intermediate-frequency second reception signal ESZF-2 (which can be the signal $ZF_21$ in FIG. 2, for example) arrives at a second analog-digital converter ADW2.

A digital first signal DS-1 in the baseband range fB is formed from the intermediate-frequency first reception signal ESZF1 with the aid of the first A/D converter ADW1 via sampling with the sampling frequency FS (already cited in FIG. 1).

A digital second signal DS-2 is formed from the intermediate-frequency second reception signal ESZF2 with the aid of the second A/D converter ADW2 via sampling with the sampling frequency FS (already cited in FIG. 1).

The two signals DS-1, DS-2 are then supplied to a downstream image processing device IMPG (designated as "Image processing").

In the present invention, intermediate-frequency ranges ZF1 and ZF2 (here with reference to FIG. 2 and FIG. 3) are used, for example, that lie mirror-symmetrical to the sampling frequency FS or mirror-symmetrical to a multiple of the sampling frequency FS of an A/D converter ADW1, ADW2 of the receiver REC1.

Furthermore, here a downmixing of the received magnetic resonance signals—more precisely once into normal position and once into inverted position—ensues on the part of the local coil arrangement 6. The employed local oscillator frequencies $LO_1$ and $LO_2$ therefore lie one above and one below the frequency of the magnetic resonance signals MR1 and MR2, for example.

After a sampling has occurred on the reception side, the digitized signals DS1 and DS2 appear in normal position and in the same frequency band.

A module "LO synthesizer" is shown in FIG. 3 whose one sub-region "1H" generates the synthesizer signal "1H synthesizer signal 115 MHz+135 MHz" (with frequencies of 115 MHz and 135 MHz) while an additional sub-region "129Xe" generates the synthesizer signal "129Xe synthesizer signal 92.5 MHz". The synthesizer signal "129Xe synthesizer signal 92.5 MHz" is transmitted (via a high-pass "HP") to the transmission path TBS-1, and the "1H synthesizer signal 115 MHz+135 MHz" is transmitted (via a high-pass "HP") to the transmission path TBS-2.

Figure 6:
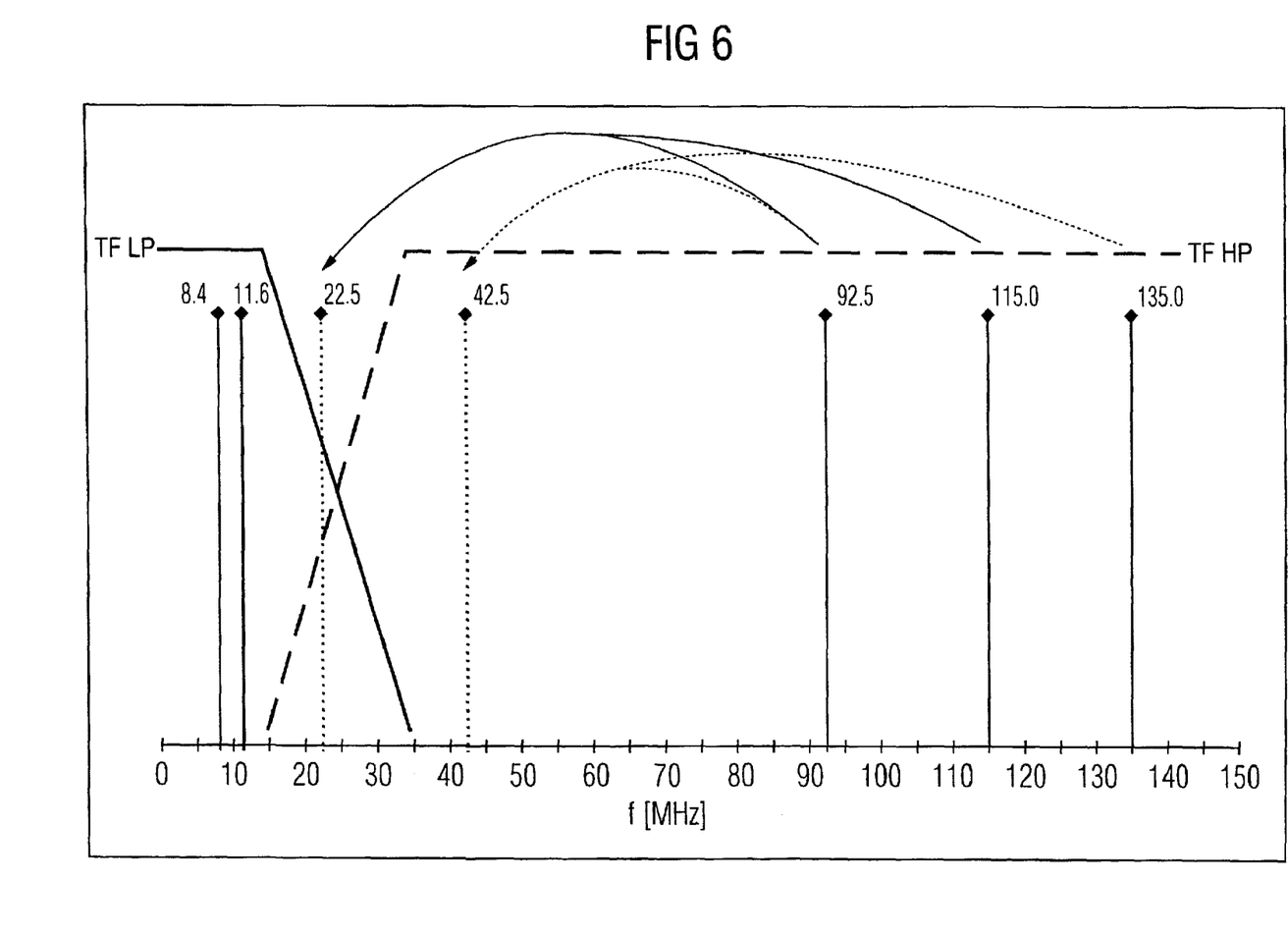
FIG. 6 is a graphical representation of a frequency plan for a configuration to receive 129Xe magnetic resonance signals.

FIG. 6 shows a graphical representation of a frequency plan for a configuration to receive 129Xe magnetic resonance signals. For example, an oscillator signal at 42.5 MHz is formed from synthesizer signals with 115.0 MHz and 92.5 MHz arriving at the local coil. For example, an oscillator signal at 22.5 MHz is formed from synthesizer signals with 135.0 MHz and 92.5 MHz arriving at the local coil.

Although modifications and changes may be suggested by those skilled in the art, it is the intention of the inventors to embody within the patent warranted hereon all changes and modifications as reasonably and properly come within the scope of their contribution to the art.

I claim as my invention:

1. A circuit for transmitting magnetic resonance signals comprising:
    a magnetic resonance local coil assembly comprising a plurality of channels;
    a first of said channels comprising a first individual antenna configured to receive a first magnetic resonance signal and a first frequency converter connected to said first individual antenna, said first frequency converter being configured to form a first signal from said first magnetic resonance signal and a first oscillator signal supplied to said first frequency converter;
    a second of said channels comprising a second individual antenna configured to receive a second magnetic resonance signal and a second frequency converter connected to said second individual antenna, said second frequency converter being configured to form a second signal from said second magnetic resonance signal and a second oscillator signal supplied to said second frequency converter;
    a signal combiner supplied with said first signal and said second signal that applies both of said first signal and said second signal to a single transmission path forming an output of said local coil assembly;
    a first input to said local coil assembly to which a first synthesizer signal is supplied, said first synthesizer signal having a first synthesizer signal frequency;
    a second input to said local coil assembly to which a second synthesizer is supplied, said second synthesizer signal having a second synthesizer signal frequency; and
    an oscillator signal source in said local coil assembly connected to said first and second inputs, said oscillator signal source supplying said first oscillator signal to said first frequency converter and supplying said second oscillator signal to said second frequency converter, and said oscillator signal source being configured to form at least one of said first and second oscillator signals with an oscillator signal frequency that is a difference between said first synthesizer signal frequency and said second synthesizer signal frequency, said first and second synthesizer signal frequencies being set so that said difference, corresponding to said oscillator signal frequency, allows said first and second signals to both be transmitted via said single transmission path.

2. A circuit as claimed in claim 1 comprising a third input to said local coil assembly to which a third synthesizer signal is supplied, said third synthesizer signal having a third synthesizer signal frequency, and wherein said oscillator signal source is configured to generate the other of said first and second oscillator signals, other than said one of said first and second oscillator signals, with an oscillator signal frequency that is a difference between said first synthesizer signal frequency and said third synthesizer signal frequency.

3. A circuit as claimed in claim 1 comprising respective coaxial cables connected to said first and second inputs, via which said first synthesizer signal and said second synthesizer signal are supplied respectively to said first and second inputs.

4. A circuit as claimed in claim 1 comprising a low pass filter connected between said oscillator signal source and said first and second frequency converters.

5. A circuit as claimed in claim 1 wherein said oscillator signal source has an oscillator signal source output at which both of said first and second oscillator signals are present, and comprising a diplexer connected between said output of said oscillator signal source and said first and second frequency converters that supplies said first oscillator signal only to said first frequency converter and that supplies said second oscillator signal only to said second frequency converter.

6. A circuit as claimed in claim 1 comprising a receiver connected to said single transmission path that receives said first and second signals via said single transmission path.

7. A circuit as claimed in claim 6 wherein said receiver comprises a signal splitter connected to said single transmission path configured to separate said first and second signals from each other.

8. A circuit as claimed in claim 1 wherein said signal combiner is a diplex filter.

9. A method for transmitting magnetic resonance signals in a magnetic resonance local coil assembly comprising a plurality of channels, said method comprising the steps of;
in a first of said channels, receiving a first magnetic resonance signal with a first individual antenna and supplying said first magnetic resonance signal to a first frequency converter connected to said first individual antenna, and in said first frequency converter, forming a first signal from said first magnetic resonance signal and a first oscillator signal supplied to said first frequency converter;
in a second of said channels, receiving a second magnetic resonance signal with a second individual antenna and supplying said second magnetic resonance signal to a second frequency converter connected to said second individual antenna, and in said second frequency converter, forming a second signal from said second magnetic resonance signal and a second oscillator signal supplied to said second frequency converter;
combining said first signal and said second signal and applying both of said first signal and said second signal to a single transmission path forming an output of said local coil assembly;
at a first input to said local coil assembly, supplying a first synthesizer signal, said first synthesizer signal having a first synthesizer signal frequency;
at a second input to said local coil assembly, supplying a second synthesizer, said second synthesizer signal having a second synthesizer signal frequency; and
from an oscillator signal source in said local coil assembly connected to said first and second inputs, supplying said first oscillator signal to said first frequency converter and supplying said second oscillator signal to said second frequency converter, and in said oscillator signal source, forming at least one of said first and second oscillator signals with an oscillator signal frequency that is a difference between said first synthesizer signal frequency and said second synthesizer signal frequency, and setting said first and second synthesizer signal frequencies so that said difference, corresponding to said oscillator signal frequency, allows said first and second signals to both be transmitted via said single transmission path.

10. A method as claimed in claim 9 comprising, at a third input to said local coil assembly, supplying a third synthesizer signal, said third synthesizer signal having a third synthesizer signal frequency, and in said oscillator signal source, generating the other of said first and second oscillator signals, other than said one of said first and second oscillator signals, with an oscillator signal frequency that is a difference between said first synthesizer signal frequency and said third synthesizer signal frequency.

11. A method as claimed in claim 9 comprising supplying said first synthesizer signal and said second synthesizer signal to said first and second inputs via respective coaxial cables.

12. A method as claimed in claim 9 comprising low pass filtering an output of said oscillator signal source.

13. A method as claimed in claim 9 wherein said oscillator signal source has an oscillator signal source output at which both of said first and second oscillator signals are present, and comprising connecting a diplexer between said output of said oscillator signal source and said first and second frequency converters and, via said diplexer, supplying said first oscillator signal only to said first frequency converter and supplying said second oscillator signal only to said second frequency converter.

14. A method as claimed in claim 9 comprising connecting a receiver to said single transmission path that receives said first and second signals via said single transmission path.

15. A method as claimed in claim 14 comprising, in said receiver, connecting a signal splitter to said single transmission path that separates said first and second signals from each other.

16. A method as claimed in claim 9 comprising combining said signals in a diplex filter in said local coil assembly.

* * * * *